(12) United States Patent  (10) Patent No.: US 7,906,366 B2
Nakatani et al.  (45) Date of Patent: Mar. 15, 2011

(54) PRINTING MASK AND SOLAR CELL

(75) Inventors: Mitsunori Nakatani, Tokyo (JP); Keizo Makino, Tokyo (JP); Hisashi Tominaga, Tokyo (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 706 days.

(21) Appl. No.: 10/591,145

(22) PCT Filed: Nov. 28, 2005

(86) PCT No.: PCT/JP2005/021781
§ 371 (c)(1),
(2), (4) Date: Aug. 30, 2006

(87) PCT Pub. No.: WO2007/060742
PCT Pub. Date: May 31, 2007

(65) Prior Publication Data
US 2008/0230118 A1  Sep. 25, 2008

(51) Int. Cl.
*H01L 31/18* (2006.01)
*H01L 31/0224* (2006.01)
(52) U.S. Cl. .......................... 438/98; 136/256; 136/252
(58) Field of Classification Search .......... 136/252–265; 438/98
See application file for complete search history.

(56) References Cited

U.S. PATENT DOCUMENTS

| | | | |
|---|---|---|---|
| 4,324,815 | A | 4/1982 | Mitani et al. |
| 5,178,685 | A | 1/1993 | Borenstein et al. |
| 6,069,065 | A | 5/2000 | Arimoto et al. |
| 2001/0039891 | A1* | 11/2001 | Takeuchi et al. ......... 101/128.21 |

FOREIGN PATENT DOCUMENTS

| | | |
|---|---|---|
| JP | 1979-112403 U | 8/1979 |
| JP | 3-136308 | 6/1991 |
| JP | 4-189545 | 7/1992 |
| JP | 6-8662 | 1/1994 |
| JP | 6-15976 | 1/1994 |
| JP | 6-143855 | * 5/1994 |
| JP | 7-81263 | 3/1995 |
| JP | 8-58259 | 3/1996 |
| JP | 9-258194 | 10/1997 |
| JP | 10-315649 | 12/1998 |
| JP | 11-245534 | 9/1999 |
| JP | 2001-18356 | 1/2001 |
| JP | 2004-179336 A | 6/2004 |
| JP | 2004-345205 | 12/2004 |

OTHER PUBLICATIONS

Japanese Office Action issued in Japanese Application No. 2006-515508, dated Jun. 1, 2010 and partial English translation thereof.

* cited by examiner

*Primary Examiner* — Jennifer K Michener
*Assistant Examiner* — Jayne Mershon
(74) *Attorney, Agent, or Firm* — Buchanan Ingersoll & Rooney PC

(57) ABSTRACT

A printing mask includes a mask frame and a mesh extended on the mask frame, in which a mask portion is formed by filling the mesh with resin to leave a pattern forming portion in a region corresponding to an electrode pattern to be formed on a printing object. The mask portion has a raised part on a surface of the mesh to be opposed to the printing object. The thickness of the raised part is such that a difference in average film thickness between the end and other parts of the electrode pattern formed with the printing mask is equal to or less than 5 micrometers.

4 Claims, 12 Drawing Sheets

|  | BEFORE IMPROVEMENT | AFTER IMPROVEMENT |
|---|---|---|
| EMULSION THICKNESS (μm) | 14 | 3 |
| NUMBER OF MESHES | 400 | 400 |
| LINE DIAMETER (μm) | 23 | 23 |
| AVERAGE ALUMINUM FILM THICKNESS dmean (μm) | 29 | 27 |
| AVERAGE FILM THICKNESS OF ALUMINUM EDGE PART dmax (μm) | 37 | 32 |
| ALUMINUM THICKNESS DIFFERENCE: dmax-dmean (μm) | 8 | 5 |
| SUBSTRATE THICKNESS | BREAKAGE RATE (%) | BREAKAGE RATE (%) |
| 200 μm | 10 | 1 |
| 240 μm | 5 | 0 |
| 280 μm | 1 | 0 |
| 330 μm | 0 | 0 |

(SQUEEGEE CONTACT SURFACE SIDE)

(PRINTING OBJECT SIDE)

PRINTING MASK AND SOLAR CELL

TECHNICAL FIELD

The present invention relates to a printing mask for forming a printing pattern by screen printing on a printing object. The present invention also relates to a solar cell, a flat panel display, and a chip capacitor with an electrode formed by using the printing mask.

BACKGROUND ART

Screen printing is used to form an electrode of a solar cell, and an electrode of a display such as a liquid crystal display, a plasma display, and an organic EL (electroluminescence) display. In screen printing, a printing mask, in which a part corresponding to an electrode to be printed on a printing object is a mesh (openings) and other parts are formed of a mesh filled with an emulsion, is arranged a predetermined distance apart from the printing object, and a paste containing an electrode material is provided to the printing mask. Thereafter, the paste is spread on the printing mask by a squeegee. The paste in only the mesh part out of the spread paste is provided onto the printing object. The paste provided onto the printing object is fired at a predetermined temperature according to the electrode material. Thereby, an electrode is formed.

As a printing mask used in screen printing, there has been conventionally proposed a printing mask prepared by coating a mesh with emulsion on the squeegee side surface, and thereafter, coating the mesh with emulsion on the surface to be opposed to a printing object. The emulsion is applied to the surface to be opposed to a printing object in a film thickness of 5 micrometers (hereinafter, "emulsion thickness"), and smoothness of the film is ensured (see, Patent Document 1).

Conventionally, at the time of applying paste on a printing object, an average film thickness of the paste applied from near the edge of the mesh part of a printing mask tends to be larger than that applied from the other parts. In order to solve the problem, there has been proposed a method of performing screen printing by using a printing mask that has a fine pattern with, for example, a U shape, a mountain shape, a wave shape, and a circle shape formed in the outline of a coating pattern, so that the amount of the paste pushed out from the printing mask decreases towards the end of the coating pattern (see, Patent Document 2).

Patent Document 1: Japanese Patent Application Laid-open No. H4-189545
Patent Document 2: Japanese Patent Application Laid-open No. H11-245534

DISCLOSURE OF INVENTION

Problem to be Solved by the Invention

A general solar cell has the configuration, for example, in which back aluminum electrode patterns are formed at a linear interval for forming a back silver electrode therein on the back surface (a p-type silicon substrate side) of a semiconductor layer having a p-n junction with a p-type silicon substrate in parallel with the substrate surface; The back silver electrode for collecting electric current is formed between the back aluminum electrode patterns to overlap a part of the back aluminum electrode patterns.

In a common printing mask used at present, emulsion is raised above a surface to be opposed to a printing object by a thickness of about 14 micrometers. When the printing mask is used to define the back aluminum electrode patterns on the back surface (the p-type silicon substrate side) of the solar cell, an average film thickness of a bulge at the edge part of the back aluminum electrode pattern is about 8 micrometers larger than the average film thickness of the central part. The film thickness is about 6 micrometers larger even with a printing mask having an emulsion thickness of 5 micrometers described in the Patent Document 1. In general, when the average film thickness of the bulge at the edge part is 5 micrometers or more larger than the average film thickness of the center of the back aluminum electrode pattern, discontinuity is caused in the back silver electrode pattern that is formed thereafter between the back aluminum electrode patterns to overlap a part of the back aluminum electrode patterns. The above problem has also occurred when an electrode pattern is formed for a flat panel display, such as a liquid crystal display, an organic EL display, and a plasma display, and a chip capacitor, in addition to a solar cell on which an electrode pattern is formed by screen printing.

According to the screen printing method described in the Patent Document 2, it is possible to suppress the occurrence of a bulge at the edge of the back aluminum electrode pattern on the back surface (the p-type silicon substrate side) of the solar cell. However, it is troublesome to form a fine pattern with, for example, a U shape, a mountain shape, a wave shape, and a circle shape, in the outline of the printing mask's coating pattern.

It is therefore an object of the present invention to provide a printing mask for forming an electrode by screen printing, by which a difference in average film thickness between the edge part and center part of a printing pattern formed by the printing mask is equal to or less than 5 micrometers. It is another object of the present invention to provide a printing mask, in which it is possible to easily form a pattern in the outline of a coating pattern such that a difference in average film thickness between the edge part and center part of a printed pattern is equal to or less than 5 micrometers. It is still another object of the present invention to provide a solar cell, a flat panel display, and a chip capacitor that have an electrode formed with the printing mask.

Means for Solving Problem

To achieve the above object, a printing mask that includes a mesh extended on a mask frame, in which a mask portion is formed by filling the mesh with resin to leave a pattern forming portion in a region corresponding to an electrode pattern to be formed on a printing object, wherein the mask portion includes a raised part that is formed to be raised above a surface of the mesh facing the printing object, and a thickness of the raised part is such that a difference in average film thickness between the end and other parts of the electrode pattern is equal to or less than 5 micrometers when the electrode pattern is formed with the printing mask.

Effect of the Invention

According to the present invention, the thickness of a bulge at the edge part of an electrode printed by the printing mask can be reduced. Specifically, a difference in average film thickness between the edge part and center part of a printing pattern can be equal to or less than 5 micrometers. As a result, in the manufacture of a device that prints plural electrodes with superimposition, when an electrode pattern is formed on another electrode pattern, it is possible to prevent discontinuity in the superimposed electrode pattern on the bulge at the edge of an electrode pattern already formed. Thereby, printing is easier from the formation process of the electrode patterns superimposed on another pattern. Therefore, a rate of good products in the manufacturing improves. Furthermore, it is only necessary to change a printing mask, and the con-

BRIEF DESCRIPTION OF DRAWINGS

FIG. 2-1 is a plan view of one example of a printing mask pattern for forming a back aluminum electrode;

FIG. 2-2 is a plan view of one example of a printing mask pattern for forming a back silver electrode;

FIG. 2-3 is a plan view of one example of a printing mask pattern for forming a front silver electrode;

FIG. 3-1 is a top view of a solar cell having an electrode formed using a printing mask according to the present invention;

FIG. 3-2 is a backside view of the solar cell shown in FIG. 3-1;

FIG. 5-1 is a cross section of one example of a solar cell for explaining a method of manufacturing the solar cell (part 1);

FIG. 5-2 is a cross section of one example of a solar cell for explaining the method of manufacturing the solar cell (part 2);

FIG. 5-3 is a cross section of one example of a solar cell for explaining the method of manufacturing the solar cell (part 3);

FIG. 5-4 is a cross section of one example of a solar cell for explaining the method of manufacturing the solar cell (part 4);

FIG. 5-5 is a cross section of one example of a solar cell for explaining the method of manufacturing the solar cell (part 5);

FIG. 5-6 is a cross section of one example of a solar cell for explaining the method of manufacturing the solar cell (part 6);

FIG. 5-7 is a cross section of one example of a solar cell for explaining the method of manufacturing the solar cell (part 7);

FIG. 6 is a cross section of a schematic configuration of a conventional printing mask;

FIG. 7 is a cross section of a solar cell formed with a conventional printing mask;

FIG. 13-1 is a plan view of a printing mask for forming a back aluminum electrode pattern of a solar cell;

FIG. 13-2 is a plan view of a printing mask for forming a back silver electrode pattern of a solar cell;

EXPLANATIONS OF LETTERS OR NUMERALS

Figure 1:
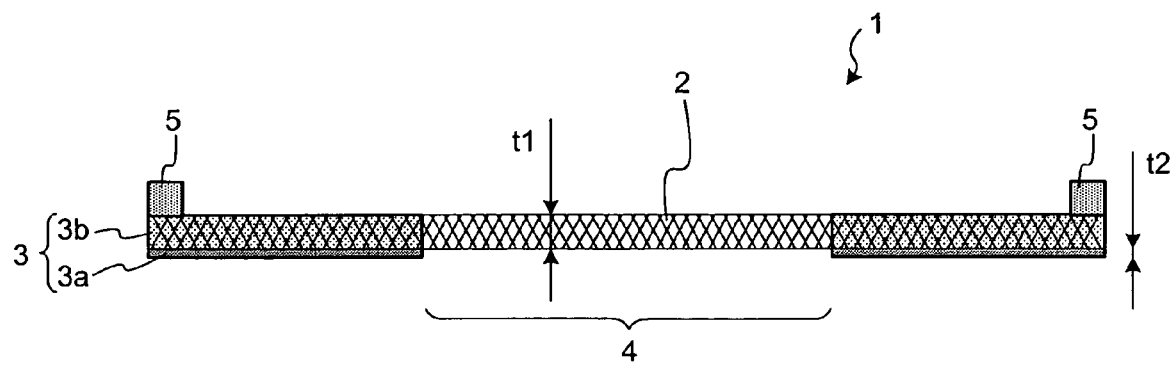
FIG. 1 is a cross section of a schematic configuration of a printing mask according to the present invention.

1 Printing mask
2 Mesh
3 Mask portion
3a Raised part
3b Filled part
3c Peripheral pattern
4 Pattern forming portion
5 Mask frame
20 Solar cell
21 Semiconductor layer
22 p-type silicon substrate
23 n-type diffusion layer
24 Antireflection coating
25 Front silver grid electrode
26 Front silver bus electrode
27 Back aluminum electrode
28 Back silver electrode
29 p+layer
41 Printing stage
42 Vacuum hole
43 Squeegee

BEST MODE(S) FOR CARRYING OUT THE INVENTION

Exemplary embodiments of a printing mask and a solar cell, a flat panel display, and a chip capacitor will be explained below in detail with reference to the accompanying drawings. Note that the present invention is not limited to the embodiments.

First Embodiment

Figures 1, 2:
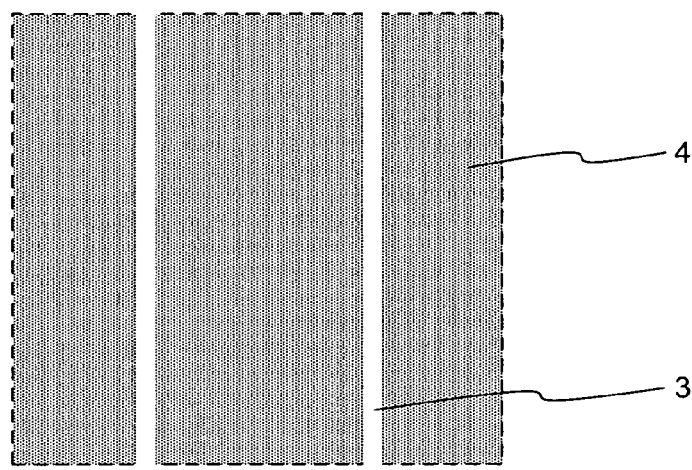
Figure 2:
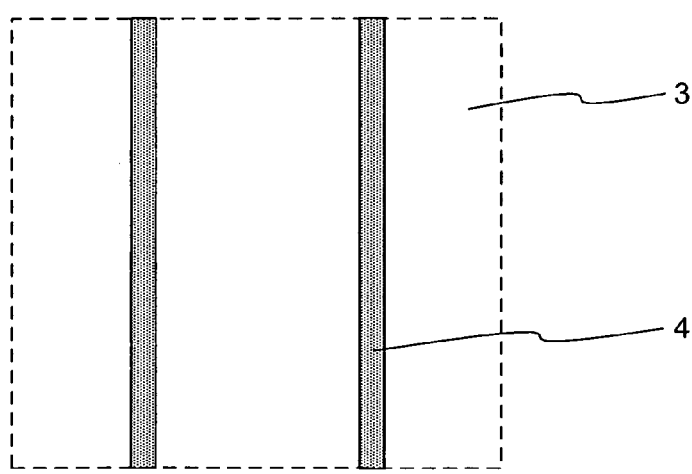
Figures 2, 3:
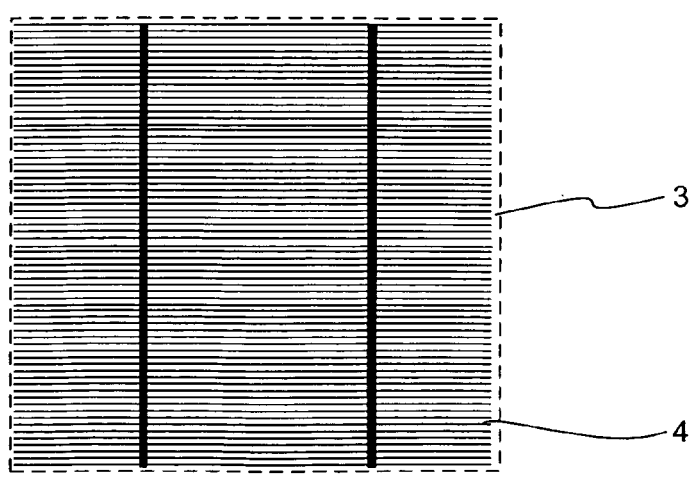
Figures 1, 3:
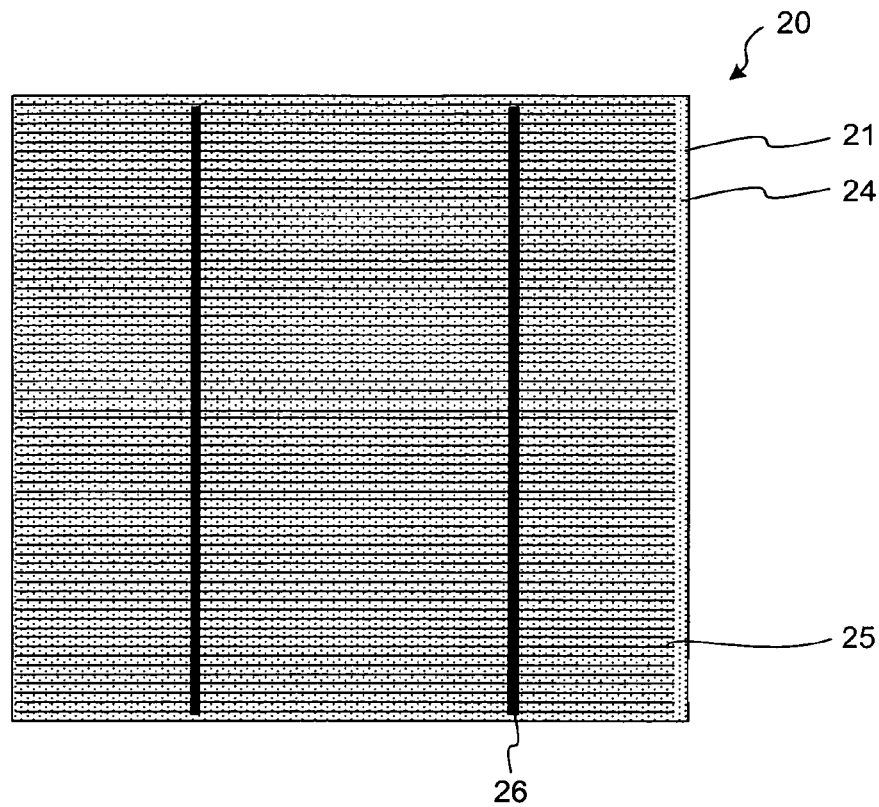
Figures 2, 3:
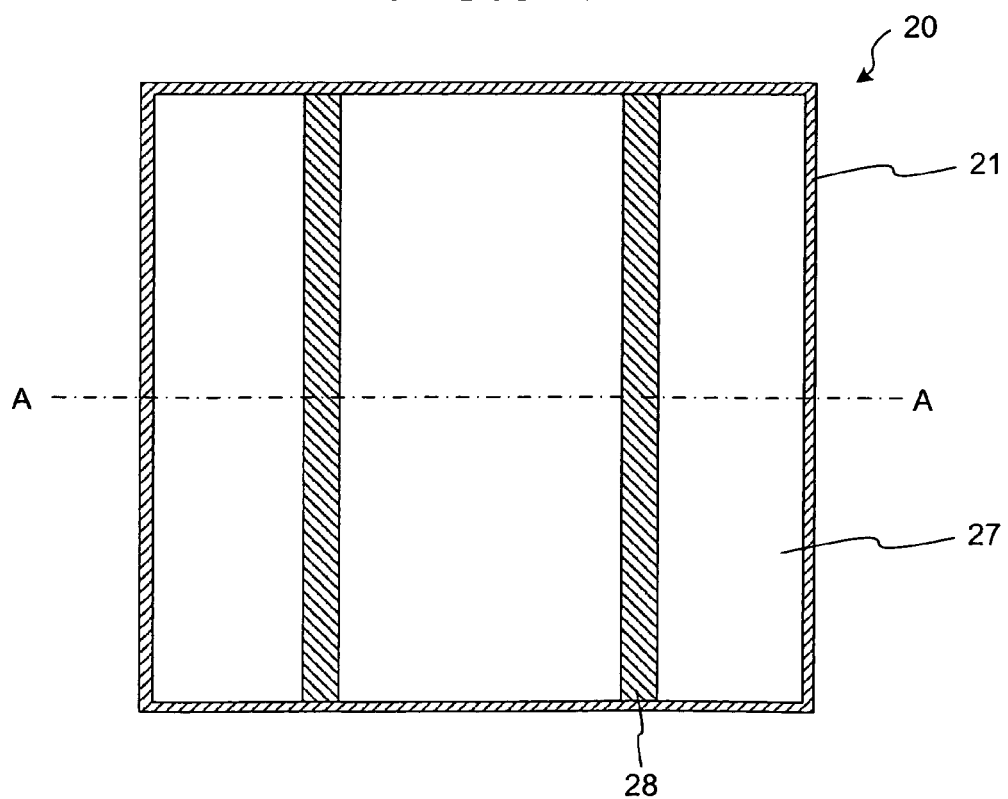
Figure 4:
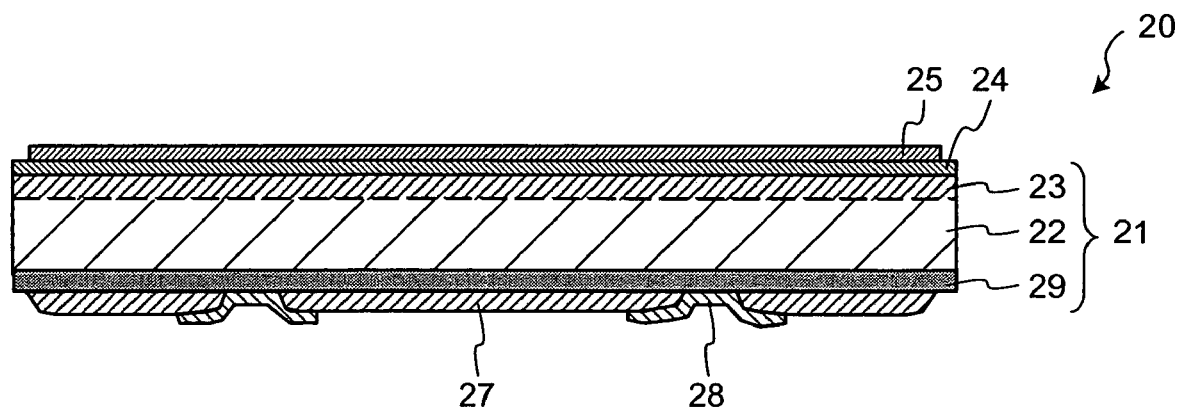
FIG. 4 is a cross section taken along the line A-A of FIG. 3-2.
Figures 1, 5:
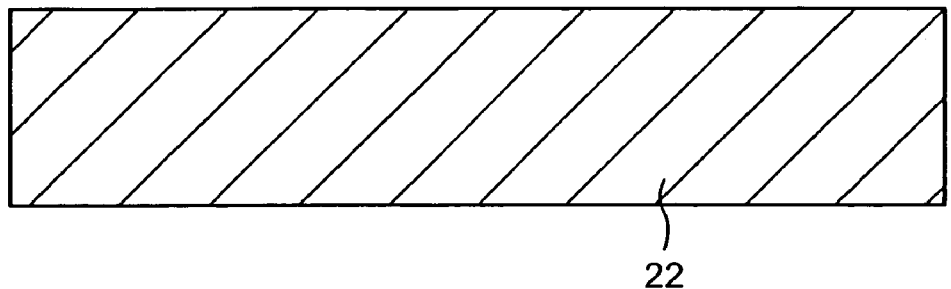
Figures 2, 5:
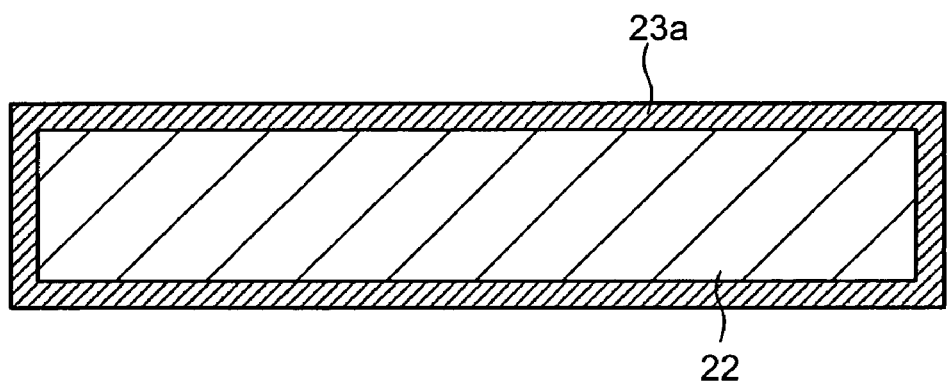
Figures 3, 5:
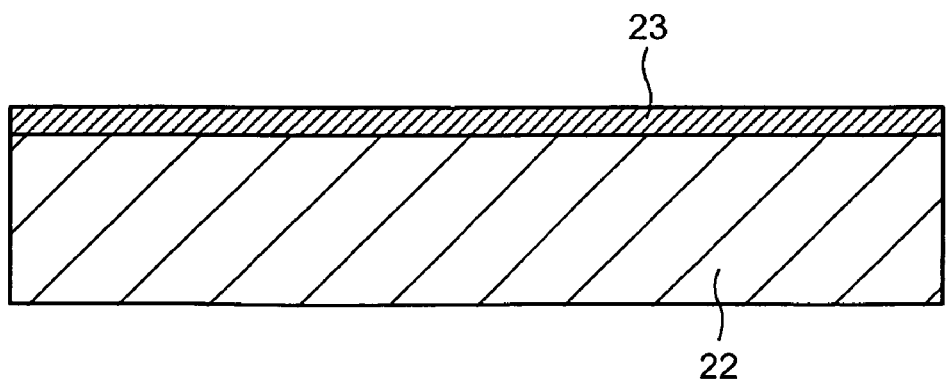
Figures 4, 5:
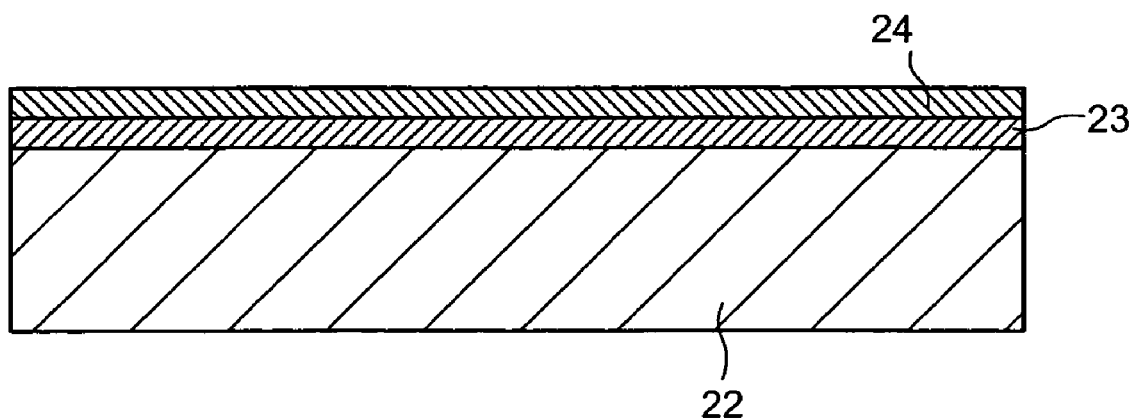
Figure 5:
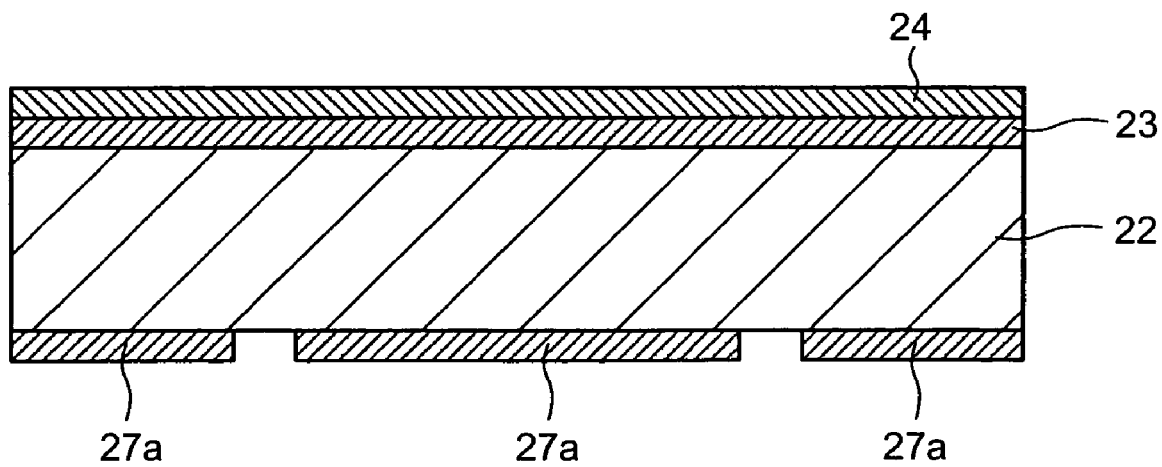
Figures 5, 6:
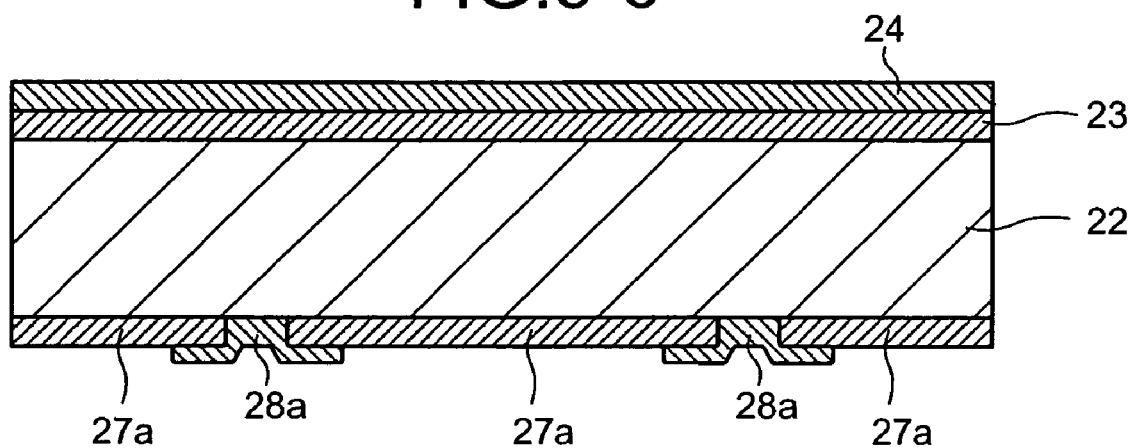
Figures 5, 6, 7:
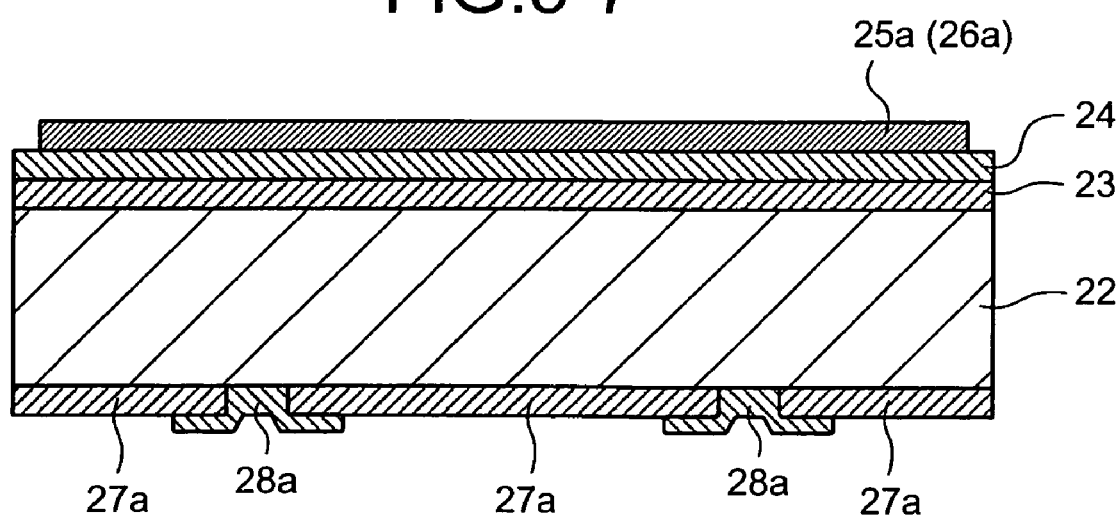
Figure 6:
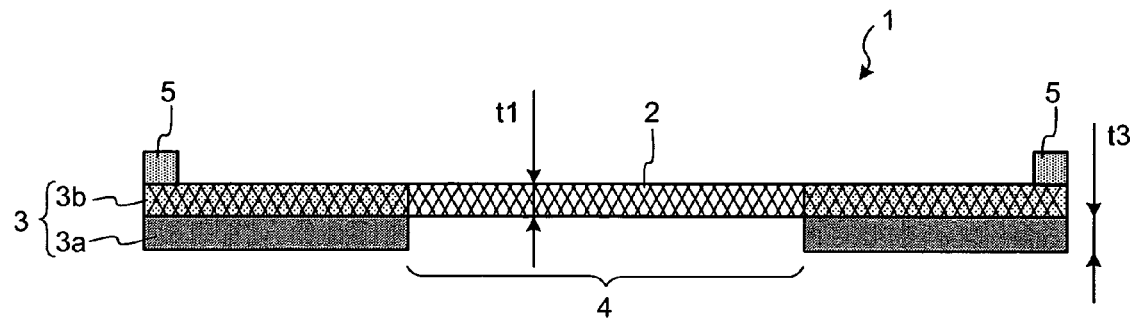
Figure 7:
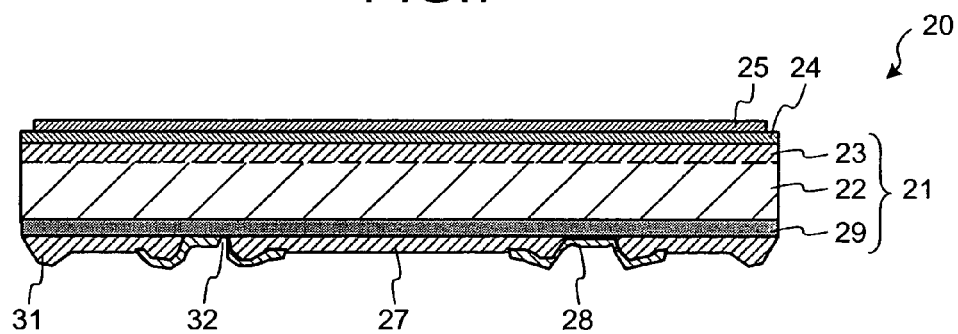
Figure 8:
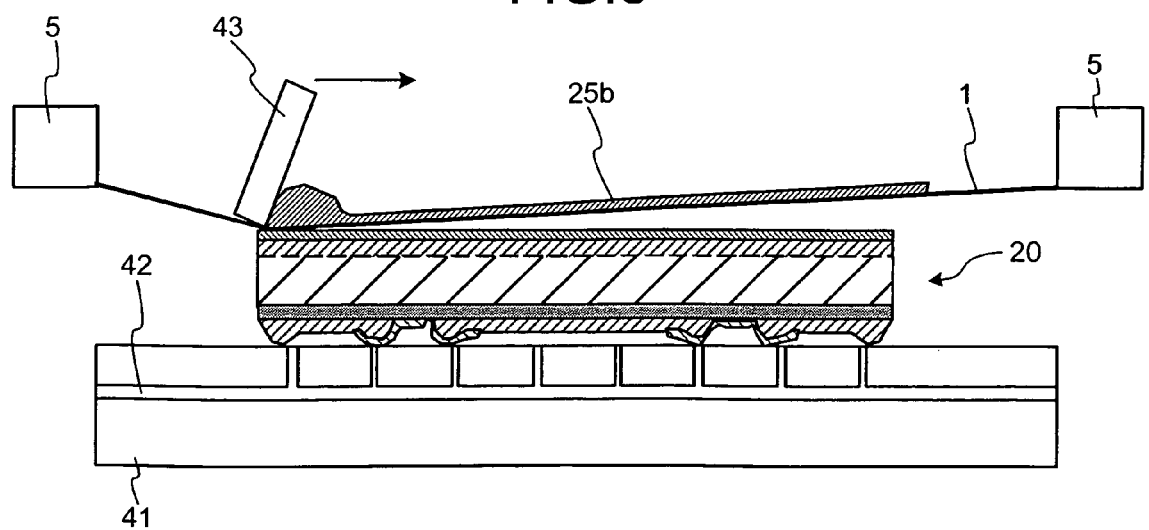
FIG. 8 is a schematic cross section of a state of forming an electrode of a solar cell with a conventional printing mask.
Figure 9:
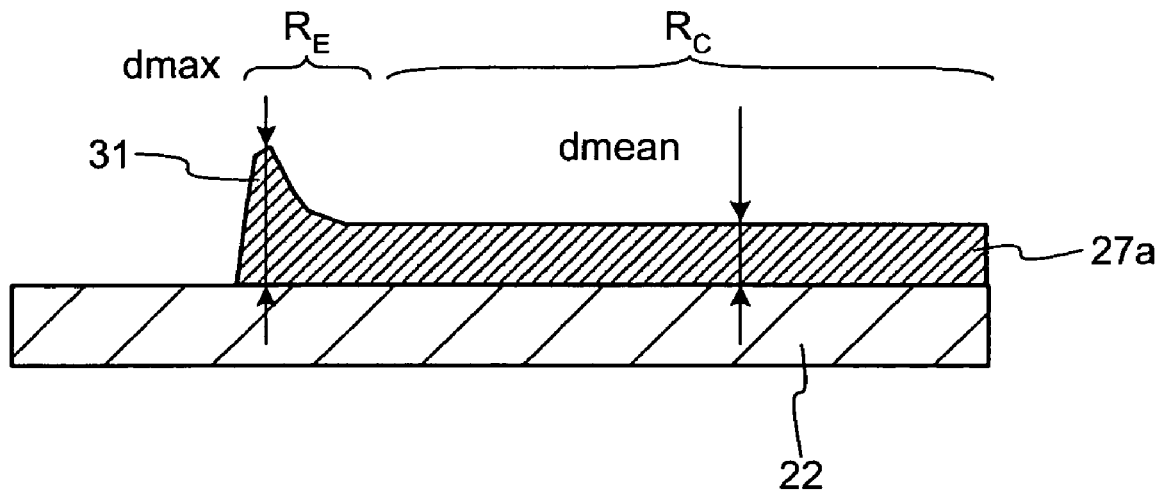
FIG. 9 is a schematic cross section of an edge part and a central part of an electrode pattern.
Figure 10:
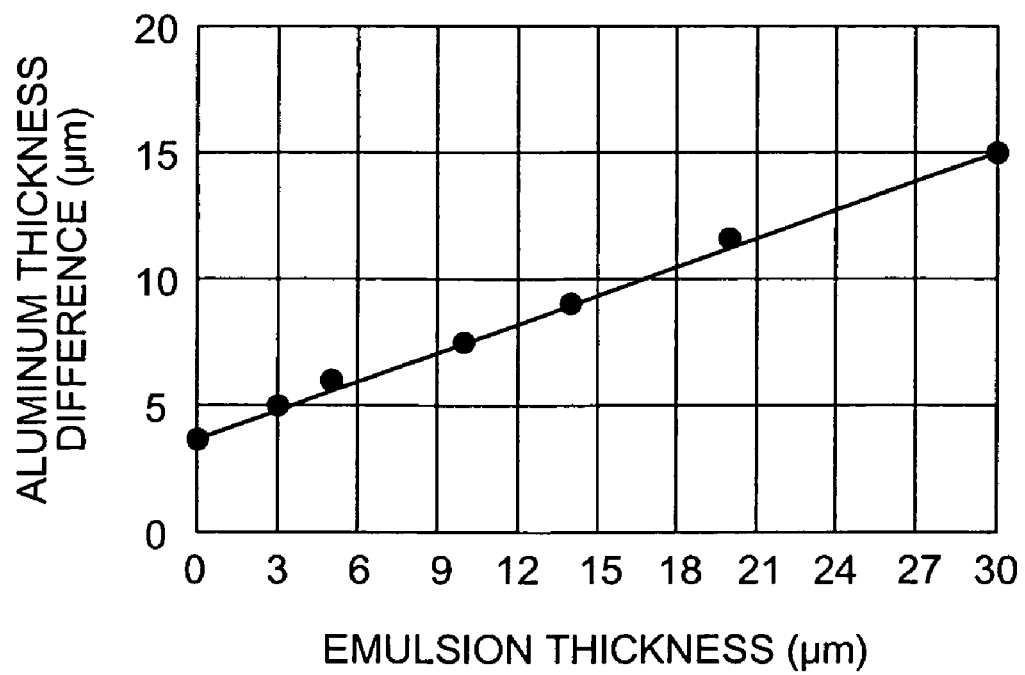
FIG. 10 is a graph of variation in the thickness of aluminum according to the thickness of emulsion at a raised part of a printing mask.
Figures 11, 12:
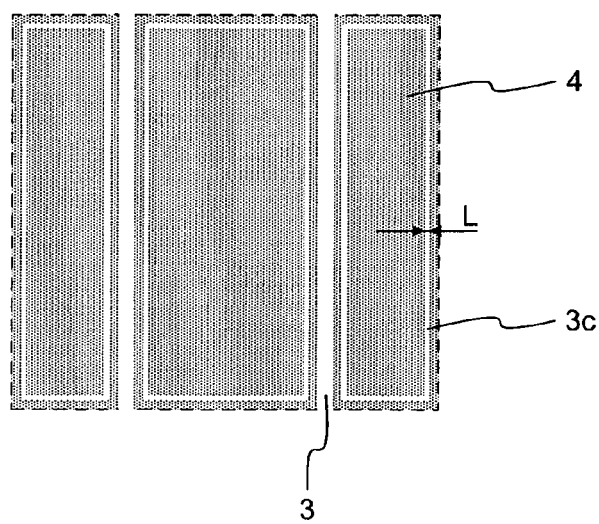
FIG. 11 is a table of correlation between conditions of a substrate mask at the time of measuring a substrate breakage rate and substrate breakage rates at different thicknesses of the substrate.
FIG. 12 is a plan view of a schematic configuration of a printing mask according to a second embodiment of the present invention.

FIG. 1 is a cross section of a schematic configuration of a printing mask according to the present invention. FIG. 2-1 is a plan view of one example of a printing mask pattern for forming a back aluminum electrode. FIG. 2-2 is a plan view of one example of a printing mask pattern for forming a back silver electrode. FIG. 2-3 is a plan view of one example of a printing mask pattern for forming a front silver electrode. FIG. 3-1 is a top view of a solar cell having an electrode formed with a printing mask according to the present invention. FIG. 3-2 is a backside view of the solar cell shown in FIG. 3-1. FIG. 4 is a cross section taken along the line A-A of FIG. 3-2. FIGS. 5-1 to 5-7 are cross sections for explaining a procedure of a method for manufacturing the solar cell. FIG. 6 is a cross section of a schematic configuration of a conventional printing mask. FIG. 7 is a cross section of a solar cell formed with a conventional printing mask. FIG. 8 is a schematic cross section for explaining a state of forming an electrode of a solar cell with the conventional printing mask. FIG. 9 is a schematic cross section of an edge part and a central part of an electrode pattern. FIG. 10 is a graph of variation in the thickness of aluminum according to the thickness of emulsion at a raised part in the printing mask. FIG. 11 is a table of correlation between conditions of a substrate mask at the time of measuring a substrate breakage rate and substrate breakage rates at different thicknesses of the substrate.

As shown in FIG. 1, a printing mask 1 is formed by filling resin, such as a polymer emulsion containing a photosensitizing agent, into mesh openings except those in a region that forms an electrode pattern in a mesh 2. The mesh 2 is made of a material such as meshed stainless extended on a mask frame 5. The region of the mesh 2 filled with the resin is called a mask portion 3. The region not filled with the resin corresponding to the region that forms the electrode pattern is called a pattern forming portion 4. The mask portion 3 is configured by forming a resin layer at least inside the mesh 2, and a resin layer on a surface of the mesh 2 to be opposed to a printing object so that the resin layer is raised above the surface. The former is called a filled part 3b, and the latter is called a raised part 3a. The thickness t1 of the filled part 3b is the same as the thickness of the mesh 2 used. The thickness of the raised part 3a (hereinafter, "emulsion thickness") t2 is less than 5 micrometers, and is preferably equal to or less than 3 micrometers. The configuration of the printing mask 1 can be applied to a back aluminum electrode (FIG. 2-1), a back silver electrode (FIG. 2-2), and a front silver electrode (FIG. 2-3) that are used to manufacture a solar cell. The printing mask according to the present invention is particularly effective to form an electrode having a large area equal to or larger than 1 square millimeter ($mm^2$) by screen printing.

The printing mask 1 is formed in the following manner. First, a liquid polymer emulsion containing a photosensitizing agent having high viscosity is applied to the mesh 2, and is dried. On this occasion, the polymer emulsion containing a photosensitizing agent is coated on a surface of the mesh 2 so that the coating is raised towards the outside from the surface by a predetermined thickness. Thereafter, by photoengraving, the emulsion is exposed, then developed into a pattern of a predetermined size (for example, electrode patterns shown in FIGS. 2-1 to 2-3), and dried. Thereby, the printing mask 1 shown in FIG. 1 is completed with the raised part 3a on the surface of the mesh 2 to be opposed to a printing object and the filled part 3b inside the mesh 2 in a region other than where the electrode pattern is formed. This method of forming the printing mask 1 is one example. The printing mask 1 can be formed by other method so long as the raised part 3a of the mask portion 3 has a thickness less than 5 micrometers. For example, a liquid polymer emulsion containing a photosensitizing agent having high viscosity is applied to the squeegee contact surface of the mesh 2 (the upper side in FIG. 1) so as not to penetrate through the mesh 2. By photoengraving, the emulsion is exposed, then developed into a pattern of a predetermined size (for example, electrode patterns shown in FIGS. 2-1 to 2-3), and dried. Thus, the filled part 3b is formed in a region other than where the electrode pattern is formed in the mesh 2. Thereafter, a liquid polymer emulsion containing a photosensitizing agent having high viscosity is applied to the surface of the mesh 2 to be opposed to a printing object (the lower side in FIG. 1), and is exposed, then developed into a pattern of the same size as the predetermined size, and dried by photoengraving. Thus, the raised part 3a is formed in a region other than where an electrode pattern is formed on the surface of the mesh 2 to be opposed to a printing object. Thereby, the printing mask 1 shown in FIG. 1 is completed.

Characteristics of the printing mask are explained next by taking as an example a solar cell on which an electrode is formed using the printing mask 1, and a solar cell on which an electrode is formed using a conventional printing mask. As shown in FIGS. 3-1 to 4, a solar cell 20 includes a semiconductor layer 21 having a photoelectric conversion function and including a p-type silicon substrate 22 as a semiconductor substrate, an n-type diffusion layer 23 with a conductivity opposite to that of the surface of the p-type silicon substrate 22, and a p+ layer (also called a BSF (Back Surface Field) layer) 29 containing high concentration of impurities; an antireflection coating 24 that is provided on the light receiving surface of the semiconductor layer 21 and prevents reflection of incident light; a front silver grid electrode 25 that is provided on the light receiving surface to locally collect electricity generated by the semiconductor layer 21; a front silver bus electrode 26 that is provided substantially orthogonal to the front silver grid electrode 25 to take out electricity collected by the front silver grid electrode 25; a back aluminum electrode 27 that is provided on substantially the entire back surface of the semiconductor layer 21 (the surface opposite to the light receiving surface) to take out electricity generated by the semiconductor layer 21 and to reflect the incident light; and a back silver electrode 28 that collects current generated in the back aluminum electrode 27. The front silver grid electrode 25 and the front silver bus electrode 26 are collectively called a front silver electrode.

In the solar cell 20 configured as above, when the solar beam is irradiated from the light receiving surface of the solar cell 20 onto a p-n junction surface (a junction surface between the p-type silicon substrate and the n-type diffusion layer) of the semiconductor layer 21, holes and electrons are generated. Due to the electric field of the p-n junction unit, the generated electrons move toward the n-type diffusion layer 23, and the holes move toward the p+ layer 29. Accordingly, the n-type diffusion layer 23 has excessive electrons, and the p+ layer 29 has excessive holes, which generates photoelectromotive force. The photoelectromotive force biases the p-n junction in a forward direction, and the front silver bus electrode 26 connected to the n-type diffusion layer 23 becomes a minus electrode, while the back silver electrode 28 connected to the p+ layer 29 becomes a plus electrode; therefore electric current flows in an external circuit (not shown).

One example of a method of manufacturing the solar cell 20 is explained next. First, as shown in FIG. 5-1, the surface-treated p-type silicon substrate 22 is prepared. Next, as shown in FIG. 5-2, phosphorus is thermally diffused to form a conductivity-inverted n-type diffusion layer 23a on the surface of the p-type silicon substrate 22. Generally, phosphorus oxychloride ($POCl_3$) is used as a phosphorus diffusion source.

Next, after one main surface of the p-type silicon substrate 22 is protected by resist, as shown in FIG. 5-3, the surface of the p-type silicon substrate 22 is etched so as to leave the n-type diffusion layer 23 on only the one main surface, and the resist is removed using an organic solvent or the like. Thereafter, as shown in FIG. 5-4, the antireflection coating 24 including a silicon oxide film, a silicon nitride film, and a titanium oxide film is formed on the surface of the n-type diffusion layer 23, in a uniform thickness, by a film forming method such as plasma CVD (chemical vapor deposition).

Next, as shown in FIG. 5-5, a back aluminum electrode pattern 27a is formed by screen printing on the surface (hereinafter, "back surface") of the p-type silicon substrate 22 opposite to the surface on which the n-type diffusion layer 23 is formed. On this occasion, aluminum paste is applied in the printing pattern (the pattern forming portion 4) to the back surface of the p-type silicon substrate 22 using the printing mask shown in FIG. 2-1. After the back aluminum electrode pattern 27a is dried, a back silver electrode pattern 28a is further formed on the back surface by screen printing as shown in FIG. 5-6. On this occasion, silver paste is applied in the printing pattern (the pattern forming portion 4) to the p-type silicon substrate 22 with the back aluminum electrode pattern 27a thereon using the printing mask shown in FIG. 2-2.

After the back silver electrode pattern 28a is dried, the p-type silicon substrate 22 is inverted, and silver paste is applied to the antireflection coating 24 by screen printing, and is dried as shown in FIG. 5-7. On this occasion, silver paste is applied to the antireflection coating 24 using the printing mask shown in FIG. 2-3. Accordingly, a front silver grid electrode pattern 25a and a front silver bus electrode pattern 26a are selectively formed on the antireflection coating 24.

The front and back electrode patterns including the front silver grid electrode pattern 25a, the front silver bus electrode pattern 26a, the back aluminum electrode pattern 27a, and the back silver electrode pattern 28a are simultaneously fired at about 700° C. to 900° C. for a few minutes. Due to the firing, on the front side of the p-type silicon substrate 22, while the antireflection coating 24 is dissolving in a glass material contained in the front silver paste that constitutes the front silver grid electrode pattern 25a and the front silver bus electrode pattern 26a, a silver material in the silver paste is brought into contact with the silicon in the n-type diffusion layer 23 on the surface of the p-type silicon substrate 22 and is solidified again. Accordingly, conduction is ensured between the front silver electrode (the front silver grid electrode 25, and the front silver bus electrode 26) and the n-type diffusion layer 23 of silicon. In the firing process, the back aluminum electrode 27 is formed, and the back aluminum electrode pattern 27a reacts with the silicon in the p-type silicon substrate 22, which forms the p+ layer 29 between the p-type silicon substrate 22 and the back aluminum electrode 27. In this manner, the front silver grid electrode 25, the front silver bus electrode 26, the back aluminum electrode 27, and the back silver electrode 28 are formed. Thus, the solar cell 20 having the configuration shown in FIGS. 3-1 to 4 is manufactured.

In the conventional printing mask, the raised part 3a of the mask portion 3 has a thickness t3 equal to or larger than 5 micrometers as shown in FIG. 6. When the solar cell is manufactured using the printing mask 1 by the process shown in FIGS. 5-1 to 5-7, the solar cell 20 has the configuration as shown in FIG. 7. In other words, the film thickness of the edge part 31 of the back aluminum electrode 27 becomes larger than the average film thickness of other parts (the central part), and a bulge is generated. When the back silver electrode 28 is formed on the back aluminum electrode 27 with the bulge, discontinuity is easily caused in the cross section of the back silver electrode 28, and a thin spot 32 is produced. The thin spot 32 causes higher resistance, and cell resistance is considerably deteriorated.

FIG. 8 is a schematic cross section of a state of forming a front silver electrode after the back aluminum electrode and the back silver electrode are formed by using the conventional printing mask as shown in FIG. 6. FIG. 8 shows a state that the solar cell 20, on the back surface of which the back aluminum electrode pattern and the back silver electrode pattern are coated and dried, is inverted, and the back surface of the solar cell 20 is mounted on a printing stage 41. A vacuum hole 42 is formed on the printing stage 41. The printing stage 41 has a function of discharging air from the vacuum hole 42 by using a vacuum pump (not shown), thereby holding and fixing a printing object (the solar cell 20) mounted on the printing stage 41.

The printing mask 1 is set above the solar cell 20 (the p-type silicon substrate) fixed on the printing stage 41 to be aligned with the solar cell 20 with a predetermined spacing from the solar cell 20. The silver paste 25b for forming the front silver grid electrode 25 and the front silver bus electrode 26 is applied in a thin layer on the surface of a squeegee 43 side of the printing mask 1. The squeegee 43 is pressed against the printing mask 1, and is slid in the direction indicated by the arrow shown in FIG. 8, thereby pushing the silver paste 25b through the pattern forming portion 4 to the solar cell 20 side. Thus, a desired pattern is printed.

In general, a silicon substrate of a solar cell has a very small thickness of 0.1 to 0.3 millimeter, and is easily broken or cracked. Therefore, when printing is performed as shown in FIG. 8, the vacuum pressure of the printing stage 41 is decreased to around the lower limit to fixedly hold the solar cell 20, or the pressing force applied to the squeegee 43 is decreased to around the lower limit for printing.

However, when the edge part 31 of the back aluminum electrode 27 is bulged like the conventional solar cell 20 shown in FIG. 7, the vacuum pressure of the printing stage 41 needs to be increased at the time of printing the front electrode shown in FIG. 8. Otherwise, the solar cell 20 (the p-type silicon substrate) is slid from the printing stage 41 during printing, and the position of the printing pattern is deviated. As a result, the solar cell 20 configured with the thin silicon substrate is broken in some cases.

If the edge part 31 of the back aluminum electrode 27 is bulged as shown in FIG. 7, when the back silver electrode 28 is printed on the back aluminum electrode 27, unevenness in the region for printing the back silver electrode pattern becomes large, the print of the back silver electrode 28 is blurred, and the thin spot 32 is generated. In order to suppress the generation of the thin spot 32 in the back silver electrode, the pressing force of the squeegee 43 needs to be increased to print the back silver electrode 28. However, the increased force often damages the solar cell 20 configured with the thin silicon substrate.

These problems occur because, if the edge part 31 of the back aluminum electrode 27 has a larger thickness than the average film thickness of other parts as shown in FIG. 7, stress is applied to the bulged edge part 31 at the time of vacuum adsorption in the printing stage 41 or pressing the printing mask 1 with the squeegee 43. It is known that the general solar cell is broken when locally applied with a stress of 100 megapascals (MPa) or more.

As to a condition not to apply a stress of 100 MPa or more to the solar cell 20, attention was focused on a difference between the average film thickness of the edge part and that of other parts in the formed electrode pattern. As shown in FIG. 9, it is assumed that the average film thickness of a region $R_E$ of the edge part 31 in the electrode pattern (the back aluminum electrode pattern 27a) is dmax, and the average film thickness of a region $R_C$ excluding the edge part 31 is dmean. The difference between dmax and dmean is referred to as an aluminum thickness difference.

As shown in FIG. 10, it was found that, when the emulsion thickness was changed in a range between 0 and 30 micrometers, there was a correlation between the emulsion thickness of the raised part 3a and the aluminum thickness difference, and that as the emulsion thickness of the raised part 3a was reduced, the aluminum thickness difference of the electrode pattern decreased. According to the experiment, it was also found that the aluminum thickness difference was required to be equal to or less than 5 micrometers as a condition for suppressing the occurrence of the thin spot 32 of the back silver electrode 28. From the above experiment, it was found that the emulsion thickness t2 was preferably equal to or less than 5 micrometers at the raised part 3a of the mask portion 3 in the printing mask 1. As just described, when the emulsion thickness t2 of the raised part 3a is set equal to or less than 3 micrometers, the aluminum thickness difference becomes equal to or less than 5 micrometers. Therefore, even if the pressing force of the squeegee 43 and the vacuum pressure of the printing stage 41 for vacuum-absorbing the solar cell 20 are applied to the solar cell 20, the local stress is about 70 MPa, thereby hardly causing the damage of the thin silicon substrate.

FIG. 11 is a table of a result of comparing breakage rates of the substrate when the front silver electrode pattern is formed between the conventional printing mask having the emulsion thickness t2 of 14 micrometers at the raised part 3a in the mask portion 3 and the printing mask having the emulsion thickness t2 of 3 micrometers according to the first embodiment.

A printing mask with the raised part 3a of the mask portion 3 having the emulsion thickness t2 of 14 micrometers, 400 meshes, and a line diameter of 23 micrometers was used as the conventional one. When the back aluminum electrode 27 was formed by using the conventional printing mask, the average aluminum film thickness dmean was 29 micrometers, the average film thickness dmax of the edge part 31 was 37 micrometers, and the aluminum thickness difference dmax-dmean was 8 micrormeters. When the front silver electrodes 25 and 26 were printed on the silicon substrate in this condition, the breakage rate was small if the substrate was thick; as the substrate thickness was reduced, the breakage rate became higher. The breakage rate was 5% when the substrate thickness was 240 micrometers, and the breakage rate was 10% when the substrate thickness was 200 micrometers.

On the other hand, a printing mask with the raised part 3a of the mask portion 3 having the emulsion thickness t2 of 3 micrometers, 400 meshes, and a line diameter of 23 micrometers was used as the one according to the first embodiment. When the back aluminum electrode 27 was formed by using this printing mask, the average aluminum film thickness dmean was 27 micrometers, the average film thickness dmax of the edge part 31 was 32 micrometers, and the aluminum thickness difference was 5 micrometers. When the front silver electrodes were printed on the silicon substrate in this condition, a breakage rate was 1% when the substrate thickness was 200 micrometers. However, the breakage rate was, in general, extremely small regardless of the substrate thickness.

According to the first embodiment, by setting the thickness of the raised part 3a of the printing mask on the side to be opposed to a printing object less than 5 micrometers, or preferably equal to or less than 3 micrometers, the difference in average film thickness between the edge part and the central part of the electrode pattern can be set equal to or less than 5 micrometers. Particularly, when a first electrode pattern and a second electrode pattern are formed by overlapping the second electrode pattern on a part of the first electrode pattern including at least the edge part, the occurrence of a thin spot in the second electrode pattern formed on the first electrode pattern can be suppressed by setting the difference in average film thickness between the edge part and other parts of the first electrode pattern equal to or less than 5 micrometers.

A device having an electrode formed by using the printing mask 1 can be manufactured at low cost with high quality in a high rate of good products with the conventional manufacturing method (manufacturing facilities) because it is only necessary to change a mask configuration and a mask pattern. Particularly, in the case of the solar cell 20 having an electrode formed by using the printing mask 1, a height of the bulge at the edge part 31 in the back aluminum electrode 27 reduced to 5 micrometers or less, and a rate of defects decreases. Therefore, the solar cells can be manufactured at low cost.

Second Embodiment

FIG. 12 is a plan view of a schematic configuration of a printing mask according to a second embodiment of the present invention. The printing mask is used to form a printing pattern of the back aluminum electrode 27 of the solar cell 20 shown in FIG. 3-2. In the printing mask, a linear mask portion 3 corresponding to the formation region of the back silver electrode 28 is formed with resin such as emulsion as previously described in connection with FIG. 2-1. In other words, the pattern forming portion 4 for forming a pattern of the back aluminum electrode 27 (hereinafter, also "back-aluminum-electrode-pattern formation region", corresponding to the pattern forming portion in the claims) is arranged with a predetermined spacing from another back-aluminum-electrode-pattern formation region adjacent thereto. A peripheral pattern 3c having a predetermined width is formed with a resin such as emulsion in the periphery of the back-aluminum-electrode-pattern formation region (the pattern forming portion 4). Specifically, the peripheral pattern 3c having a predetermined width L is formed of a resin, along the periphery of the back-aluminum-electrode-pattern formation region (the pattern forming portion 4), a predetermined distance inside the external periphery of the back-aluminum-electrode pattern formation region (the pattern forming portion 4). In the example shown in FIG. 12, a resin is formed into a frame in the periphery of the back-aluminum-electrode-pattern formation region. A formation region of the resin formed in the periphery can be anywhere between a bulged portion formed in the edge part 31 of the back aluminum electrode pattern 27a and the end of the back-aluminum-electrode-pattern formation region; the formation region can be changed according to the type of paste used for an electrode material (a size of a metal particle used, a shape (a flat particle is also present in addition to a spherical particle), and a paste viscosity), a number of meshes, and a line diameter of the printing mask.

For example, when the aluminum paste includes an aluminum particle having a particle diameter of 1 to 15 micrometers and has a viscosity of 30 to 100 pascalseconds (Pa.s) based on a measurement by using a B-type rotor viscometer, and also as the mesh 2 of the printing mask 1 is used the one that has 150 to 400 mesh openings and a line diameter of 23 to 45 micrometers, it is preferable to arrange a line pattern having a line width L equal to or less than 0.2 millimeter in a frame shape within a region not less than 0.1 millimeter and not more than 0.5 millimeter apart from the end (edge part) of the back-aluminum-electrode-pattern formation region (the pattern forming portion 4).

Upon using a silver paste that includes metal material for forming a fine line pattern, for example, when the silver paste includes a silver particle having a particle diameter of equal to or less than 1 micrometer and has a viscosity of 40 to 150 Pa.s based on a measurement by using a B-type rotor viscometer, and also as the mesh 2 of the printing mask 1 is used the one that has 250 to 500 mesh openings and a line diameter of 18 to 30 micrometers, it is possible to image a line pattern having a line width L of 0.1 to 0.2 millimeter, within a range not less than 0.1 millimeter and not more than 0.5 millimeter apart from the end (edge part) of the back-aluminum-electrode-pattern formation region (the pattern forming portion 4).

This printing mask is manufactured, for example, by the following method. First, a liquid polymer emulsion containing a photosensitizing agent having high viscosity is applied to the mesh 2, and is dried. On this occasion, the polymer emulsion containing a photosensitizing agent is coated on a surface of the mesh 2 so that the coating is raised towards the outside from the surface by a predetermined thickness. Thereafter, by photoengraving, the emulsion is exposed, then developed into a pattern of a predetermined size (for example, electrode patterns shown in FIG. 12), and dried. Thereby, the printing mask 1 shown in FIG. 12 is completed, which has the filled part 3b in the mesh 2 at a region other than where the electrode pattern is formed, and the peripheral pattern 3c at a position a predetermined distance inside the external periphery of the electrode pattern formation region (the pattern forming portion 4). This method of forming the printing mask is one example. The printing mask can be formed by other methods so long as the printing mask has the filled part 3b in the mesh 2 at a region other than where the electrode pattern is formed, and the peripheral pattern 3c at a position a predetermined distance inside the external periphery of the electrode pattern formation region (the pattern forming portion 4). For example, a liquid polymer emulsion containing a photosensitizing agent having high viscosity is applied to the squeegee contact surface of the mesh so as not to penetrate through the mesh 2. By photoengraving, the emulsion is exposed, then developed into a pattern of a predetermined size (for example, a pattern shown in FIG. 12), and dried. Thereby, the filled part 3b of the mask portion 3 is formed. The filled part (the peripheral pattern 3c) is also formed at the position a predetermined distance inside the external periphery of the electrode pattern formation region (the pattern forming portion 4) shown in FIG. 12. Thereafter, a liquid polymer emulsion containing a photosensitizing agent having high viscosity is applied to the surface of the mesh 2 to be opposed to a printing object toward the outside, and is exposed, then developed into the pattern of the same size as that of the filled part 3b including the peripheral pattern 3c, and dried by photoengraving. As a result, the raised part 3a of the mask portion 3 is formed. In this case, the emulsion thickness t2 of the raised part 3a can be arbitrary. Thus, the printing mask having the line pattern (the peripheral pattern 3c) formed on the periphery of the electrode pattern formation position is completed.

Figures 1, 13:
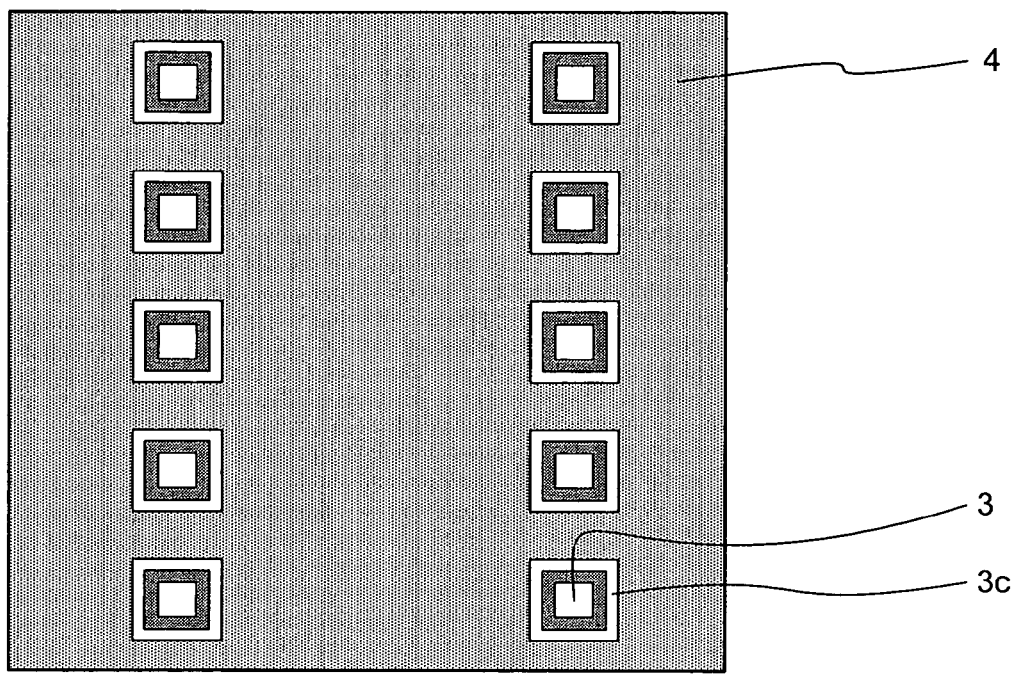
Figures 2, 13:
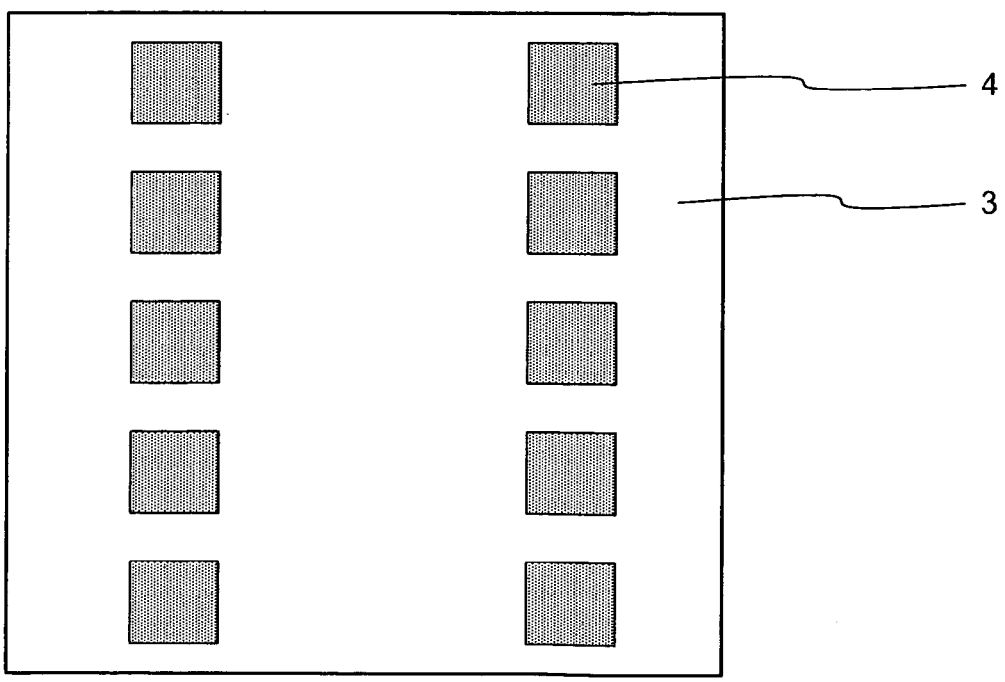

FIGS. 13-1 and 13-2 are plan views of other examples of a printing mask according to the present invention. The printing masks shown in FIGS. 13-1 and 13-2 are used for forming an electrode pattern on the back side of the solar cell. Differently from the configuration shown in FIG. 12, a back silver electrode, or a collector electrode, is not formed into a linear one but formed on spots. FIG. 13-1 is a plan view of a printing mask for forming a back aluminum electrode pattern of a solar cell, and FIG. 13-2 is a plan view of a printing mask for forming a back silver electrode pattern of the solar cell. As shown in FIG. 13-1, the peripheral pattern 3c having a predetermined width is formed of a resin along the periphery of a region corresponding to the back-silver-electrode-pattern formation region (the pattern forming portion 4). On the back silver electrode pattern shown in FIG. 13-2, because another electrode pattern is not formed thereon, a line pattern (the peripheral pattern 3c) is not formed in the periphery of the back-silver-electrode-pattern formation region (the pattern forming portion 4). A size of the pattern forming portion 4 is equal to or larger than that of the region encircled by the peripheral pattern 3c in FIG. 13-1.

The printing mask having a line pattern formed in the periphery of the electrode pattern formation region according to the second embodiment can be applied to printing masks in general. In other words, the printing mask can be applied to a conventional printing mask, and can also be applied to the printing mask explained in the first embodiment.

In the printing mask according to the second embodiment, a fine line pattern is arranged at a position corresponding to a bulge formed at the end of the electrode pattern, thereby reducing the bulge by applying a principle that a fine pattern formed in a mesh cannot be imaged by paste flow. In the printing mask, as in the first embodiment, the difference in average film thickness between the edge part and the central part of the electrode pattern can be set equal to or less than 5 micrometers. Accordingly, when, for example, the back silver electrode pattern is formed on the back aluminum electrode pattern in the solar cell having the configuration as shown in FIG. 4, the solar cell 20 that prevents the thin spot 32 from being generated can be manufactured.

According to the second embodiment, when a line pattern is provided in the periphery of the back-silver-electrode-pattern formation region (the pattern forming portion 4) of the printing mask to form the electrode pattern with the printing mask, generation of a bulge at the edge of the electrode pattern can be suppressed. As a result, when another electrode pattern is formed to be superimposed on the bulge, the generation of the thin spot 32 in the superimposed electrode pattern can be prevented. As compared with the printing mask described in the Patent Document 2, the line pattern (the peripheral pattern 3c) formed in the periphery of the electrode pattern formation region (the pattern forming portion 4) of the printing mask according to the second embodiment is simple. Therefore, the printing mask can be easily manufactured.

Third Embodiment

Figure 14:
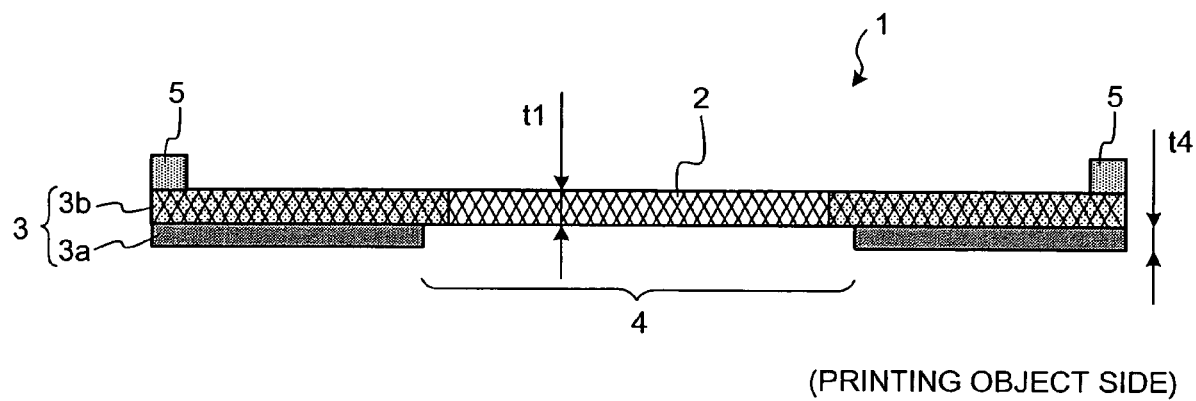
FIG. 14 is a cross section of a schematic configuration of a printing mask according to a third embodiment of the present invention.

FIG. 14 is a cross section of a schematic configuration of a printing mask according to a third embodiment of the present invention. The printing mask 1 is formed by filling resin, such as a polymer emulsion containing a photosensitizing agent, into mesh openings except those in a region that forms an electrode pattern in the mesh 2. The mesh 2 is made of a material such as meshed stainless extended on the mask frame 5. In the mask portion 3 according to the third embodiment, the end of the filled part 3b formed inside the mesh is extended into the pattern forming portion 4 by a predetermined length from the end of the raised part 3a. The thickness t1 of the filled part 3b is the same as the thickness of the mesh 2. The emulsion thickness t4 of the raised part 3a can be arbitrary. The configuration of the printing mask 1 can be applied to the back aluminum electrode (FIG. 2-1) that is used to manufacture a solar cell, the printing mask for forming the back silver electrode (FIG. 2-2) and the front silver electrode (FIG. 2-3). Incidentally, the end of the raised part 3a is recessed by 0.3 millimeter from the end of the filled part 3b.

One example of a method of forming the printing mask is explained next. A liquid polymer emulsion containing a photosensitizing agent having high viscosity is applied to the squeegee contact surface of the mesh 2 so as not to penetrate through the mesh 2. By photoengraving, the emulsion is exposed, then developed into a pattern of a predetermined size (such as various patterns shown in FIG. 2-1 to FIG. 2-3), and dried. Thereby, the filled part 3b of the mask portion 3 is formed. Thereafter, a liquid polymer emulsion containing a photosensitizing agent having high viscosity is applied to the surface of the mesh 2 to be opposed to a printing object toward the outside, and is dried, and is exposed, then developed into a pattern having the external periphery recessed by a predetermined length compared to a desired size (of the filled part 3b), and dried by photoengraving. As a result, the raised part 3a of the mask portion 3 is formed, and thereby, the printing mask 1 shown in FIG. 14 is completed.

Figure 15:
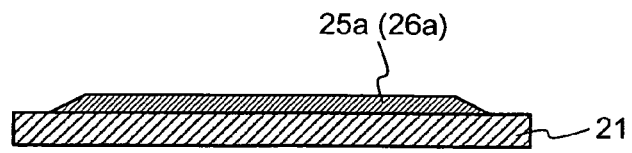
FIG. 15 is a schematic cross section of an electrode pattern formed with a printing mask according to the present invention.

FIG. 15 is a schematic cross section of an electrode pattern formed by using the printing mask. When a front silver electrode pattern 25a (26a) is formed on the semiconductor layer 21 by using the printing mask 1 having the raised part 3a with the end being recessed from the end of the filled part 3b, the occurrence of a bulge in the edge of the front silver electrode pattern 25a (26a) is suppressed. This is because the emulsion thickness is zero micrometer in the filled part 3b (corresponding to the edge of the electrode pattern) inside the mesh 2 in which the raised part 3a is not formed, and the film thickness of this part is small. A distance from the end of the raised part 3a to the end of the filled part 3b needs to be larger than the distance that forms the bulge at the edge of the formed electrode pattern, and is about 0.3 millimeter.

According to the third embodiment, the occurrence of a bulge at the edge of the electrode pattern formed with the printing mask 1 can be suppressed. As a result, when another electrode pattern is formed to be superimposed on the bulge, an electrode thin spot can be prevented from being generated in the electrode pattern on the superimposed side that is stretched out due to the bulge.

In the embodiments described above, the present invention is applied to a solar cell as an example. The above printing mask can also be used to stack electrodes of a flat panel display such as a liquid crystal display, an organic EL display, and a plasma display, which include display elements arranged in a matrix that display an image by switching lights from a self-light emitting element or another light source; a circuit that drives the individual display elements; and an electrode having a predetermined pattern connected to this circuit. The above printing mask can also be used to form an internal electrode in a chip capacitor having plural dielectric sheets in layers, each with an internal electrode formed in a predetermined pattern.

INDUSTRIAL APPLICABILITY

As described above, a printing mask according to the present invention is effective for screen printing, and is particularly suitable to form superimposed electrodes.

The invention claimed is:

1. A printing mask comprising a mask frame and a mesh extended on the mask frame, wherein the printing mask includes
   a first resin layer that is formed inside the mesh, wherein a thickness of the first resin layer is equivalent to a thickness of the mesh;
   a second resin layer that is formed directly on a surface of the first resin layer, wherein thickness of the second resin layer is 3 micrometers or less;
   a pattern forming portion in which the second resin layer is not formed, wherein the pattern forming portion is located in a region corresponding to an electrode pattern to be formed on a printing object;
   a mask portion in which the first resin layer and the second resin layer are formed, wherein the mask portion is located in a region other than the region of the pattern forming portion; and
   a peripheral portion in which the first resin layer is formed, but the second resin layer is not formed, wherein the peripheral portion is located within the pattern forming portion and along a periphery of the pattern forming portion.

2. The printing mask according to claim 1, wherein the peripheral portion is located within a range corresponding to a width of a bulge from an end of the electrode pattern, which is formed at the end of the electrode pattern on forming the electrode pattern.

3. The printing mask according to claim 1, wherein the peripheral portion has a width of equal to or smaller than 0.2 millimeter, and is located within a range not less than 0.1 millimeter and not more than 0.5 millimeter from the periphery of the pattern forming portion.

4. A method of forming a solar cell comprising:
   forming a semiconductor layer on a semiconductor substrate having a p-n junction in parallel with a substrate surface;
   forming a front silver electrode in a predetermined shape on a surface of the semiconductor layer;
   forming a back aluminum electrode with the printing mask according to claim 1 on a back surface of the semiconductor layer so that a part of the semiconductor layer is exposed; and
   forming a back silver electrode to cover an exposed part that is not covered by the back aluminum electrode on the semiconductor layer and a part of the back aluminum electrode arranged adjacent to the exposed part, and
   wherein a film forming the back aluminum electrode has a difference in average film thickness between a bulge at an edge part of the back aluminum electrode and other parts of the back aluminum electrode equal to or less than 5 micrometers.

* * * * *